United States Patent
Ueno et al.

(10) Patent No.: US 9,148,116 B2
(45) Date of Patent: *Sep. 29, 2015

(54) PIEZOELECTRIC LAMINATE, SURFACE ACOUSTIC WAVE DEVICE, THIN-FILM PIEZOELECTRIC RESONATOR, AND PIEZOELECTRIC ACTUATOR

(75) Inventors: Mayumi Ueno, Suwa (JP); Takamitsu Higuchi, Matsumoto (JP); Takeshi Kijima, Matsumoto (JP)

(73) Assignee: Seiko Epson Corporation (JP)

( * ) Notice: Subject to any disclaimer, the term of this patent is extended or adjusted under 35 U.S.C. 154(b) by 1357 days.

This patent is subject to a terminal disclaimer.

(21) Appl. No.: 12/556,232

(22) Filed: Sep. 9, 2009

(65) Prior Publication Data

US 2010/0013894 A1    Jan. 21, 2010

Related U.S. Application Data

(62) Division of application No. 12/175,794, filed on Jul. 18, 2008, now abandoned, which is a division of application No. 11/634,009, filed on Dec. 5, 2006, now Pat. No. 7,482,736.

(30) Foreign Application Priority Data

Dec. 6, 2005   (JP) ................... 2005-351955
Apr. 17, 2006  (JP) ................... 2006-113494

(51) Int. Cl.
*B41J 2/45*      (2006.01)
*H03H 9/02*      (2006.01)
*H01L 41/08*     (2006.01)
*H01L 41/187*    (2006.01)
*H01L 41/318*    (2013.01)

(52) U.S. Cl.
CPC ....... *H03H 9/02031* (2013.01); *H01L 41/0815* (2013.01); *H01L 41/1873* (2013.01); *H03H 9/02574* (2013.01); *H01L 41/318* (2013.01)

(58) Field of Classification Search
None
See application file for complete search history.

(56) References Cited

U.S. PATENT DOCUMENTS 3,768,032 A    10/1973  Mitchell
6,884,364 B2   4/2005   Sato et al.

(Continued)

FOREIGN PATENT DOCUMENTS

CN    1644562    7/2005
CN    1647923    8/2005

(Continued)

OTHER PUBLICATIONS

"Hot pressing of potassium-sodium niobates", Jaeger R. E. et al., Journal of the american Ceramic Society, Blackwell Publishing, Malden, MA, US. vol. 45, No. 5, May 1, 1962, pp. 209-213, XP001179221.

Blomqvist, "Electro-optical Na0.5Na0.5NbO3 Films", Doctoral Thesis, May 20, 2005.

(Continued)

*Primary Examiner* — Erica Lin
(74) *Attorney, Agent, or Firm* — Harness, Dickey & Pierce, P.L.C.

(57) ABSTRACT

A piezoelectric laminate including a base and a first piezoelectric layer formed above the base and including potassium sodium niobate. The first piezoelectric layer is shown by a compositional formula $(K_aNa_{1-a})_xNbO_3$, "a" and "x" in the compositional formula being respectively $0.1 < a < 1$ and $1 \le x \le 1.2$.

6 Claims, 16 Drawing Sheets

(56) References Cited

U.S. PATENT DOCUMENTS

| | | |
|---|---|---|
| 7,009,328 B2 | 3/2006 | Kitagawa |
| 7,265,482 B2 | 9/2007 | Higuchi et al. |
| 7,309,450 B2 * | 12/2007 | Nanao et al. ............ 252/62.9 R |
| 7,323,806 B2 | 1/2008 | Shibata et al. |
| 7,348,711 B2 | 3/2008 | Ikeda et al. |
| 7,350,904 B2 | 4/2008 | Noguchi et al. |
| 7,482,736 B2 | 1/2009 | Ueno et al. |
| 7,559,128 B2 | 7/2009 | Kitagawa |
| 2001/0028285 A1* | 10/2001 | Klee et al. ................. 333/188 |
| 2002/0008743 A1* | 1/2002 | Murai ........................ 347/71 |
| 2005/0185026 A1 | 8/2005 | Noguchi et al. |
| 2005/0200235 A1 | 9/2005 | Higuchi et al. |
| 2008/0157629 A1 | 7/2008 | Noguchi et al. |

FOREIGN PATENT DOCUMENTS

| | | |
|---|---|---|
| JP | 10-065488 | 3/1998 |
| JP | 2000-278084 | 10/2000 |
| JP | 2003-55048 | 2/2003 |
| JP | 2003-300776 A | 10/2003 |
| JP | 2004-066600 A | 3/2004 |
| JP | 2004-096050 | 3/2004 |
| JP | 2005-012200 | 1/2005 |
| JP | 2007-019302 | 1/2007 |
| WO | WO02102738 A1 * | 12/2002 |

OTHER PUBLICATIONS

Mats Blomqvist, "Electro-Optical $Na_{0.5}K_{0.5}NbO_3$ Films", Stockholm, Sweden (2005).

* cited by examiner

PIEZOELECTRIC LAMINATE, SURFACE ACOUSTIC WAVE DEVICE, THIN-FILM PIEZOELECTRIC RESONATOR, AND PIEZOELECTRIC ACTUATOR

This application is a divisional of U.S. patent application Ser. No. 12/175,794 filed on Jul. 18, 2008, which is a divisional of U.S. patent application Ser. No. 11/634,009 filed on Dec. 5, 2006 (now U.S. Pat. No. 7,482,736 issued Jan. 27, 2009). This application claims the benefit of Japanese Patent Application No. 2006-113494 filed Apr. 17, 2006, and Japanese Application No. 2005-351955 filed Dec. 6, 2005. The disclosures of the above applications are incorporated herein by reference.

BACKGROUND OF THE INVENTION

The present invention relates to a piezoelectric laminate including a potassium sodium niobate layer, and a surface acoustic wave device, a thin-film piezoelectric resonator, and a piezoelectric actuator including the piezoelectric laminate.

A demand for a surface acoustic wave device has rapidly increased along with a remarkable development in the communication field represented by mobile communication such as a portable telephone. The development of the surface acoustic wave device has been trending toward a reduction in size and an increase in efficiency and frequency. This requires a higher electromechanical coupling factor (coefficient) ($k^2$), more stable temperature properties, and a higher surface acoustic wave propagation velocity.

A surface acoustic wave device has been mainly used which has a structure in which interdigital transducers are formed on a piezoelectric single crystal. As typical examples of the piezoelectric single crystal, a rock crystal, lithium niobate ($LiNbO_3$), lithium tantalate ($LiTaO_3$), and the like can be given. For example, $LiNbO_3$ with a high electromechanical coupling factor is used for an RF filter for which an increase in band and a decrease in loss in the passband are required. A rock crystal with a small temperature coefficient of frequency is used for an IF filter for which stable temperature properties are required in a narrow band. $LiTaO_3$ with an electromechanical coupling factor and a temperature coefficient of frequency between those of $LiNbO_3$ and a rock crystal plays an intermediate role between $LiNbO_3$ and a rock crystal. In recent years, a cut angle of a potassium niobate ($KNbO_3$) single crystal showing a high electromechanical coupling factor has been found. A $KNbO_3$ single crystal plate is disclosed in JP-A-10-65488.

In a surface acoustic wave device using a piezoelectric single crystal base, properties such as the electromechanical coupling factor, temperature coefficient, and speed of sound are specific to the material and determined by the cut angle and the propagation direction. For example, a 0° Y-X $KNbO_3$ single crystal base has an excellent electromechanical coupling factor, but does not show zero temperature properties at or near room temperature, differing from a 45° to 75° rotated Y-X $KNbO_3$ single crystal base.

SUMMARY

According to a first aspect of the invention, there is provided a piezoelectric laminate comprising:
a base; and
a first piezoelectric layer formed above the base and including potassium sodium niobate.

According to a second aspect of the invention, there is provided a surface acoustic wave device comprising the above-described piezoelectric laminate.

According to a third aspect of the invention, there is provided a thin-film piezoelectric resonator comprising the above-described piezoelectric laminate.

According to a fourth aspect of the invention, there is provided a piezoelectric actuator comprising the above-described piezoelectric laminate.

DETAILED DESCRIPTION OF THE EMBODIMENT

The invention may provide a piezoelectric laminate in which a potassium sodium niobate layer is formed on a base.

The invention may also provide a surface acoustic wave device and a thin-film piezoelectric resonator including the above piezoelectric laminate.

The invention may further provide a piezoelectric actuator including the above piezoelectric laminate.

According to one embodiment of the invention, there is provided a piezoelectric laminate comprising:

a base; and a first piezoelectric layer formed above the base and including potassium sodium niobate.

In this piezoelectric laminate, the first piezoelectric layer may be shown by a compositional formula $(K_aNa_{1-a})_xNbO_3$, "a" and "x" in the compositional formula being respectively $0.1<a<1$ and $1 \leq x \leq 1.2$.

In this piezoelectric laminate, "x" in the compositional formula of the first piezoelectric layer may be $1<x \leq 1.1$.

In this piezoelectric laminate, an orientation control layer may be formed below the first piezoelectric layer.

In this piezoelectric laminate, the orientation control layer may include nickel lanthanate. The nickel lanthanate may be polycrystalline.

The piezoelectric laminate may further comprise:

a second piezoelectric layer continuous with the first piezoelectric layer and including potassium sodium niobate, wherein the second piezoelectric layer may include an element forming a layer which contacts the second piezoelectric layer and is positioned opposite to the first piezoelectric layer.

In this piezoelectric laminate, the first piezoelectric layer may include:

a first-phase portion including a piezoelectric of a compositional formula $(K_aNa_{1-a})NbO_3$; and a second-phase portion including a piezoelectric of a compositional formula $(K_aNa_{1-a})_xNbO_3$, in which "x" is larger than 1.

The piezoelectric laminate may further comprise an electrode formed above the first piezoelectric layer.

The piezoelectric laminate may further comprise:

a first electrode formed between the base and the first piezoelectric layer; and a second electrode formed above the first piezoelectric layer.

According to one embodiment of the invention, there is provided a surface acoustic wave device comprising the above-described piezoelectric laminate.

According to one embodiment of the invention, there is provided a thin-film piezoelectric resonator comprising the above-described piezoelectric laminate.

According to one embodiment of the invention, there is provided a piezoelectric actuator comprising the above-described piezoelectric laminate.

Embodiments of the invention will be described below with reference to the drawings.

1. PIEZOELECTRIC LAMINATE

1.1. First Piezoelectric Laminate

Figure 1:
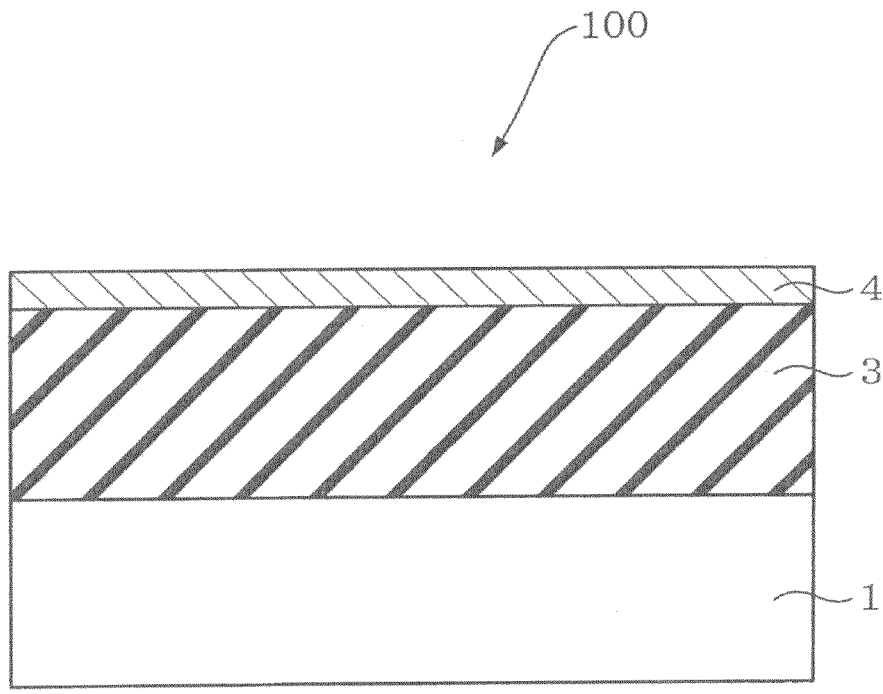
FIG. 1 is a cross-sectional view schematically showing a first piezoelectric laminate according to one embodiment of the invention.

FIG. 1 is a cross-sectional view schematically showing an example of a first piezoelectric laminate 100 according to this embodiment.

The first piezoelectric laminate 100 includes a base 1, a piezoelectric layer 3 formed on the base 1 and including potassium sodium niobate, and an electrode 4 formed on the piezoelectric layer 3.

The base 1 is selected depending on the application of the piezoelectric laminate 100. The material and the structure of the base 1 are not particularly limited. As the base 1, an insulating substrate, a semiconductor substrate, or the like may be used. As the insulating substrate, a sapphire substrate, an STO substrate, a plastic substrate, a glass substrate, or the like may be used. As the semiconductor substrate, a silicon substrate or the like may be used. The base 1 may be a single substrate or a laminate in which another layer is stacked on a substrate.

Figure 4:
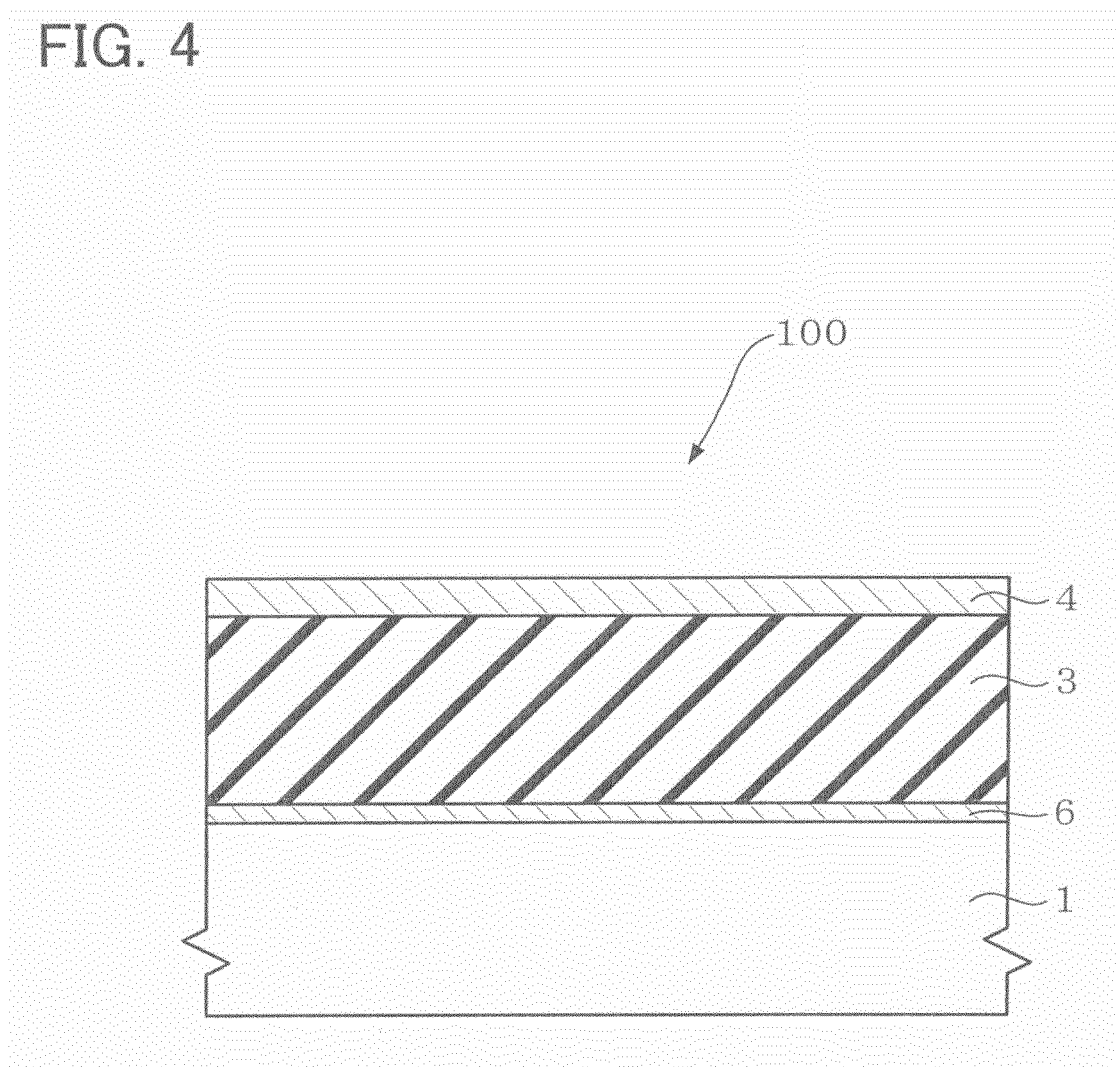
FIG. 4 is a cross-sectional view schematically showing a modification of the first piezoelectric laminate according to one embodiment of the invention.

As shown in FIG. 4, an orientation control layer 6 may optionally be provided on the base 1. The orientation control layer 6 is called a buffer layer or a seed layer, and has a function of controlling the crystal orientation of the piezoelectric layer 3. Specifically, the piezoelectric layer 3 formed on the orientation control layer 6 is provided with a crystal structure similar to the crystal structure of the orientation control layer 6. As the orientation control layer 6, a complex oxide having a crystal structure similar to that of the piezoelectric layer 3 may be used. For example, a perovskite oxide such as nickel lanthanate ($LaNiO_3$) may be used as the orientation control layer 6. Nickel lanthanate may be polycrystalline. It suffices that the orientation control layer 6 control the orientation of the piezoelectric layer 3. The orientation control layer 6 may have a thickness of 50 to 100 nanometers, for example.

The piezoelectric layer 3 includes a piezoelectric of the compositional formula $(K_aNa_{1-a})_xNbO_3$. In the above compositional formula, "a" is preferably $0.1<a<1$, and more preferably $0.2 \leq a \leq 0.7$, and "x" is preferably $1 \leq x \leq 1.2$, and more preferably $1<x \leq 1.1$. The piezoelectric of the compositional formula $(K_aNa_{1-a})_xNbO_3$ has an orthorhombic crystal structure at room temperature. If "a" in the above compositional formula is within the above range, the phase change temperature from an orthorhombic crystal to a rhombohedral crystal ($a \leq 0.55$) and the phase change temperature from an orthorhombic crystal to a monoclinic crystal ($0.55 \leq a$) are decreased to $-40°$ C. or less, whereby stable characteristics can be obtained in a low temperature region. If "a" is 0.1 or less, a heterophase occurs during crystallization heat treatment due to volatilization of potassium, whereby characteristics such as piezoelectric characteristics and ferroelectric characteristics are adversely affected. If "x" is within the above range, since the crystal is formed at a low temperature, volatilization of potassium is suppressed, whereby the layer density is improved.

Figure 2:
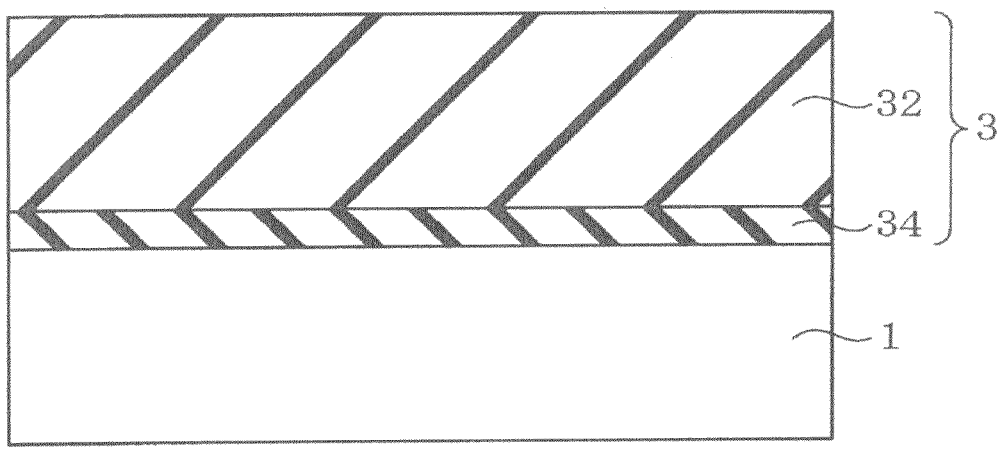
FIG. 2 is a cross-sectional view schematically showing a piezoelectric layer of a piezoelectric laminate according to one embodiment of the invention.
Figure 3:
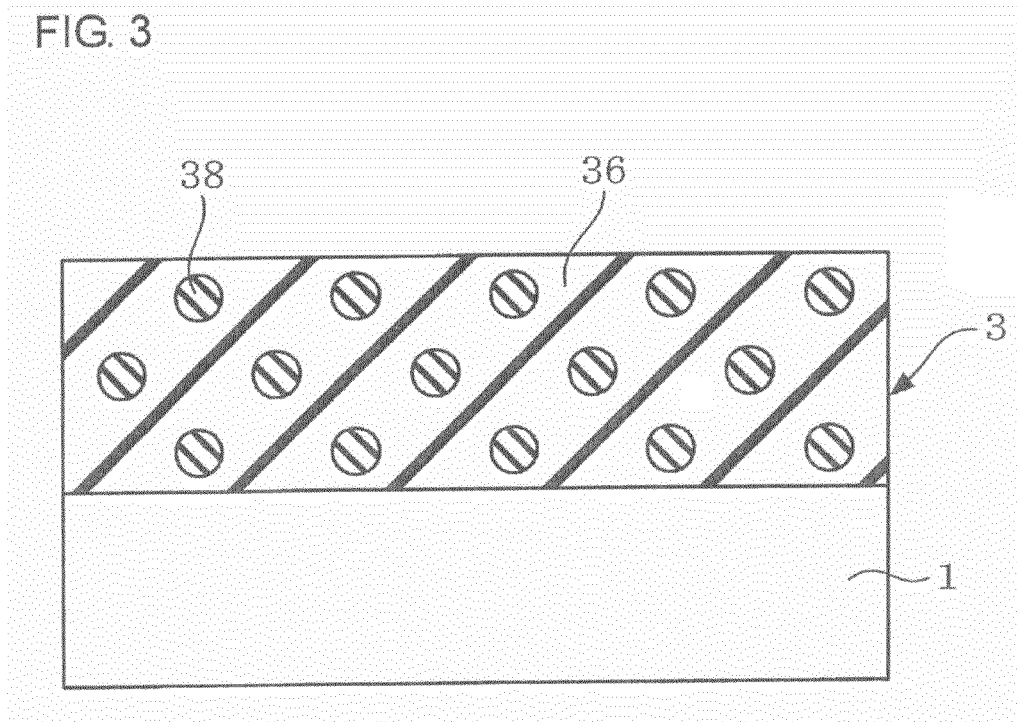
FIG. 3 is a cross-sectional view schematically showing another piezoelectric layer of a piezoelectric laminate according to one embodiment of the invention.

In this embodiment, the piezoelectric layer 3 may be a homogeneous layer, or may be a layer having a structure as shown in FIG. 2 or 3. FIGS. 2 and 3 are conceptual or schematic views.

As shown in FIG. 2, the piezoelectric layer 3 may include a first piezoelectric layer 32 including potassium sodium niobate of the compositional formula $(K_aNa_{1-a})NbO_3$, and a second piezoelectric layer 34 formed between the first piezoelectric layer 32 and the base 1 and including a piezoelectric containing at least an element forming a layer (base 1 in the example shown in FIG. 2) contacting the piezoelectric layer 3. The second piezoelectric layer 34 may include potassium and sodium (A-site elements) in excess in comparison with the first piezoelectric layer 32. The second piezoelectric layer 34 includes potassium sodium niobate forming the first piezoelectric layer 32 and an element forming the base 1. For example, when using an STO ($SrTiO_3$) substrate as the base 1, the second piezoelectric layer 34 may include potassium sodium niobate, strontium, and titanium. When using Nb:STO (Nb-doped $SrTiO_3$) for the base 1, the second piezoelectric layer 34 may include potassium sodium niobate, strontium, titanium, and niobium. When the orientation control layer 6 is provided on the base 1, as shown in FIG. 4, the second piezoelectric layer 34 may include an element forming the orientation control layer 6. For example, when using nickel lanthanate for the orientation control layer 6, the second piezoelectric layer 34 includes potassium sodium niobate, lanthanum, and nickel.

As shown in FIG. 3, the piezoelectric layer 3 may include a first-phase portion 36 including a piezoelectric of the compositional formula $(K_aNa_{1-a})NbO_3$, and a second-phase portion 38 including a piezoelectric of the compositional formula $(K_aNa_{1-a})_xNbO_3$ (wherein $1<x$).

It is preferable that the piezoelectric layer 3 according to this embodiment be pseudocubic (100) preferentially oriented.

The thickness of the piezoelectric layer 3 is typically selected depending on the application of the piezoelectric laminate 100. The thickness of the piezoelectric layer 3 is typically 300 nanometers to 3.0 micrometers. Note that the upper limit of the thickness of the piezoelectric layer 3 may be increased up to about 10 micrometers insofar as the density and the crystal orientation of the thin layer are maintained.

The electrode 4 may be formed of a metal layer or a conductive complex oxide layer. The electrode 4 may be a laminate of a metal layer and a conductive complex oxide layer. As the material for the electrode 4, a metal layer formed of platinum, iridium, aluminum, or the like or a conductive complex oxide layer formed of iridium oxide or the like may be used.

The first piezoelectric laminate 100 according to this embodiment may be formed as follows, for example.

(1) The base 1 is provided. The base 1 is selected depending on the application of the piezoelectric laminate 100, as described above. As the base 1, an STO ($SrTiO_3$) substrate, an Nb:STO (Nb-doped $SrTiO_3$) substrate, a sapphire substrate, or the like may be used.

(2) As shown in FIG. 1, the piezoelectric layer 3 including a piezoelectric of the above compositional formula is formed on the base 1.

When forming the piezoelectric layer 3 using a sol-gel method or an MOD method, the piezoelectric layer 3 may be formed by applying a coating layer using a precursor solution which provides a composition of the above compositional formula, and crystallizing the coating layer.

The precursor solution as the material for forming the piezoelectric layer 3 may be prepared by mixing organometallic compounds respectively containing the constituent metal of the piezoelectric material forming the piezoelectric layer 3 so that the metals are contained at a desired molar ratio, and dissolving or dispersing the organometallic compounds using an organic solvent such as an alcohol. As the organometallic compounds respectively containing the constituent metal of the piezoelectric material, an organometallic compound such as a metal alkoxide, an organic acid salt, or a beta-diketone complex may be used. Specific examples of the piezoelectric material are given below.

As the organometallic compound containing sodium (Na), sodium ethoxide and the like can be given. As the organometallic compound containing potassium (K), potassium ethoxide and the like can be given. As the organometallic compound containing niobium (Nb), niobium ethoxide and the like can be given. The organometallic compounds respectively containing the constituent metal of the piezoelectric material are not limited to the above compounds. Known compounds may also be used.

Various additives such as a stabilizer may optionally be added to the precursor solution. When causing the precursor solution to undergo hydrolysis and polycondensation, an acid or a base may be added to the precursor solution as a catalyst together with an appropriate amount of water.

The raw material solution is prepared so that the piezoelectric layer 3 has a desired composition ratio. The piezoelectric layer 3 can be formed by applying the raw material solution to the base 1 and crystallizing the coating layer by heat treatment. In more detail, a series of steps including a raw material solution application step, a solvent (e.g. alcohol) removal step, a coating layer drying heat treatment step, and a cleaning heat treatment step is performed a desired number of times, and the resulting product is fired by crystallization annealing to form the piezoelectric layer 3. The piezoelectric layer 3 may also be formed by performing a series of steps including the above application step, solvent removal step, coating layer drying heat treatment step, cleaning heat treatment step, and crystallization annealing step a desired number of times.

(3) As shown in FIG. 1, the electrode 4 is formed on the piezoelectric layer 3. A metal layer or a conductive complex oxide layer forming the electrode 4 is formed by known sputtering or the like.

(4) If necessary, post annealing may be performed in an oxygen atmosphere by utilizing rapid thermal annealing (RTA) or the like. This provides an excellent interface between the electrode 4 and the piezoelectric layer 3, and improves the crystallinity of the piezoelectric layer 3.

When forming the piezoelectric laminate 100 including the orientation control layer 6 on the base 1, as shown in FIG. 4, the orientation control layer 6 is formed on the base 1 after the step (1). When using nickel lanthanate for the orientation control layer 6, the orientation control layer 6 may be formed by sputtering. The piezoelectric layer 3 can exhibit a higher crystallinity and orientation due to the crystal structure of the orientation control layer 6 as a result of forming the orientation control layer 6.

The first piezoelectric laminate 100 according to this embodiment can be manufactured by the above-described steps.

The piezoelectric layer 3 includes a piezoelectric of the compositional formula $(K_aNa_{1-a})_xNbO_3$ by forming the piezoelectric layer 3 as described above. This piezoelectric is a perovskite oxide having an orthorhombic crystal structure at room temperature.

1.2. Second Piezoelectric Laminate

Figure 5:
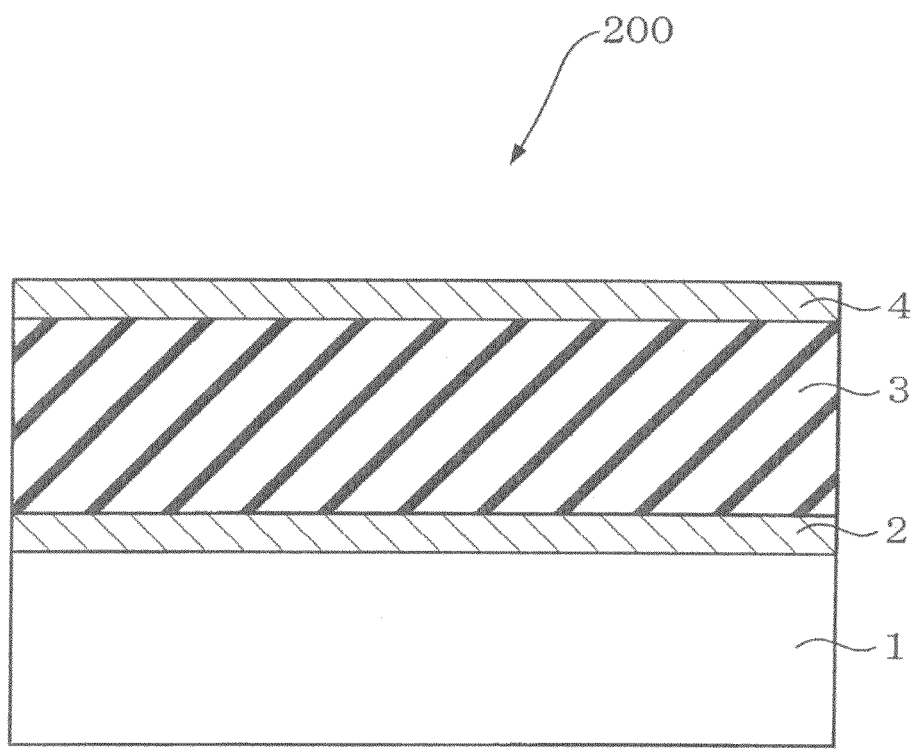
FIG. 5 is a cross-sectional view schematically showing a second piezoelectric laminate according to one embodiment of the invention.

FIG. 5 is a cross-sectional view schematically showing an example of a second piezoelectric laminate 200 according to this embodiment.

The second piezoelectric laminate 200 includes the base 1, a first electrode (lower electrode) 2 formed on the base 1, the piezoelectric layer 3 formed on the lower electrode 2, and a second electrode (upper electrode) 4 formed on the piezoelectric layer 3.

The base 1 is selected depending on the application of the piezoelectric laminate 200. The material and the structure of the base 1 are not particularly limited. As the base 1, the substrate described for the first piezoelectric laminate 100 may be used.

As the lower electrode 2, a metal layer formed of platinum or the like or a conductive complex oxide layer may be used. A conductive layer having a multilayer structure in which a metal layer and a conductive complex oxide layer are stacked may also be used as the lower electrode 2. The uppermost layer of the lower electrode 2 may be a conductive layer which functions as a buffer layer. The buffer layer may have a crystal structure similar to that of the piezoelectric layer 3 in the same manner as in the first piezoelectric laminate 100. When the buffer layer has such a structure, the piezoelectric layer 3 is provided with a crystal structure similar to the crystal structure of the buffer layer.

Figure 6:
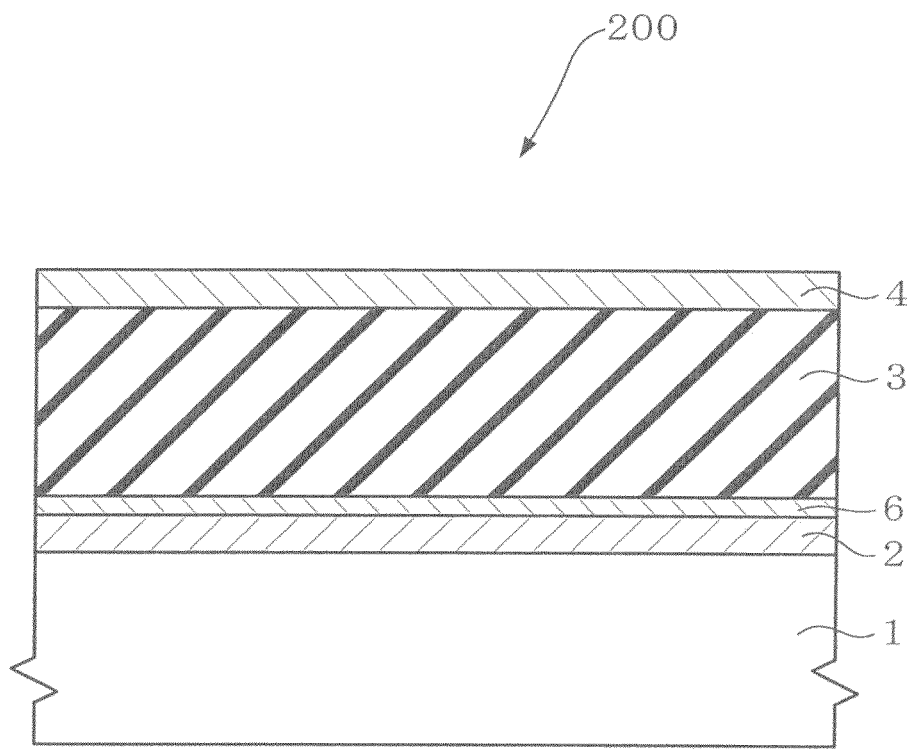
FIG. 6 is a cross-sectional view schematically showing a modification of the second piezoelectric laminate according to one embodiment of the invention.

As shown in FIG. 6, the orientation control layer 6 may optionally be provided on the lower electrode 2. The orientation control layer 6 is the same as that described for the first piezoelectric laminate 100. The orientation control layer 6 is called a buffer layer or a seed layer, and has a function of controlling the crystal orientation of the piezoelectric layer 3.

The piezoelectric layer 3 is the same as the piezoelectric layer 3 of the first piezoelectric laminate 100. Specifically, the piezoelectric layer 3 includes a piezoelectric of the compositional formula $(K_aNa_{1-a})_xNbO_3$. In the above compositional formula, "a" is preferably $0.1<a<1$, and more preferably $0.2 \leq a \leq 0.7$, and "x" is preferably $1 \leq x \leq 1.2$, and more preferably $1<x \leq 1.1$. The piezoelectric of the compositional formula $(K_aNa_{1-a})_xNbO_3$ has an orthorhombic crystal structure at room temperature. If "a" in the above compositional formula is within the above range, the phase change temperature from an orthorhombic crystal to a rhombohedral crystal ($a \leq 0.55$) and the phase change temperature from an orthorhombic crystal to a monoclinic crystal ($0.55 \leq a$) are decreased to $-40°$ C. or less, whereby stable characteristics can be obtained in a low temperature region. Items regarding the ranges of "a" and "x" in the compositional formula and the features of the piezoelectric layer 3 are the same as described for the first piezoelectric laminate 100. Therefore, detailed description thereof is omitted.

When the piezoelectric layer has a structure corresponding to FIG. 2, the piezoelectric layer 3 may include the first piezoelectric layer 32 including a piezoelectric of the compositional formula $(K_aNa_{1-a})NbO_3$, and the second piezoelectric layer 34 formed between the first piezoelectric layer 32 and the base 1 and including a piezoelectric (potassium sodium niobate containing potassium and/or sodium in excess) containing at least an element forming a layer (lower electrode 2 in the example shown in FIG. 5) contacting the piezoelectric layer 3.

When the piezoelectric layer has a structure corresponding to FIG. 3, the piezoelectric layer 3 may include the first-phase portion 36 including a piezoelectric of the compositional formula $(K_aNa_{1-a})NbO_3$, and the second-phase portion 38 including a piezoelectric of the compositional formula $(K_aNa_{1-a})_xNbO_3$ (wherein $1<x$).

The upper electrode 4 may be formed of a metal layer, a conductive complex oxide layer, or a laminate of a metal layer and a conductive complex oxide layer in the same manner as the lower electrode 2. Specifically, a metal layer formed of platinum, iridium, or the like or a conductive complex oxide layer formed of iridium oxide or the like may be used as the upper electrode 4.

The second piezoelectric laminate 200 according to this embodiment may be formed as follows, for example.

(1) A base 1 is provided. As a base 1, the base 1 described for the first piezoelectric laminate 100 may be used. For example, a silicon substrate may be used as the base 1.

(2) As shown in FIG. 5, the lower electrode 2 is formed on the base 1. A metal layer or a conductive complex oxide layer forming the lower electrode 2 is formed by known sputtering or the like.

(3) As shown in FIG. 5, the piezoelectric layer 3 of the above compositional formula is formed on the lower electrode 2. The method of forming the piezoelectric layer 3 is the same as that for the first piezoelectric laminate 100. Therefore, detailed description thereof is omitted.

(4) As shown in FIG. 5, the upper electrode 4 is formed on the piezoelectric layer 3. The structure and the formation method of a metal layer or a conductive complex oxide layer forming the upper electrode 4 are the same as those of the electrode 4 of the first piezoelectric laminate 100. Therefore, detailed description thereof is omitted.

(5) If necessary, post annealing may be performed in an oxygen atmosphere utilizing RTA or the like. This provides an excellent interface between each of the lower electrode 2 and the upper electrode 4 and the piezoelectric layer 3, and improves the crystallinity of the piezoelectric layer 3.

When forming the piezoelectric laminate 200 including the orientation control layer 6 on the lower electrode 2, as shown in FIG. 6, the orientation control layer 6 is formed on the lower electrode 2 after the step (2). When using nickel lanthanate for the orientation control layer 6, the orientation control layer 6 may be formed by sputtering. The piezoelectric layer 3 can exhibit a higher crystallinity and orientation due to the crystal structure of the orientation control layer 6 as a result of forming the orientation control layer 6.

The second piezoelectric laminate 200 according to this embodiment can be manufactured by the above-described steps.

The piezoelectric layer 3 may be formed using a liquid phase method such as a sol-gel method or a metal organic decomposition (MOD) method or a vapor phase method such as a laser ablation method or a sputtering method.

The first and second piezoelectric laminates 100 and 200 include the piezoelectric layer 3 with excellent piezoelectric characteristics, and may be suitably applied to various applications described later.

2. EXAMPLES

Examples according to the invention are described below. Note that the invention is not limited to the following examples.

2.1. Example 1

Potassium ethoxide, sodium ethoxide, and niobium ethoxide were mixed at a molar ratio of K:Na:Nb=1.0:0.2:1.0. The mixed liquid was refluxed in butyl cellosolve to prepare a triple alkoxide solution. Then, diethanolamine was added to the solution as a stabilizer. A precursor solution was thus prepared. Note that acetic acid may be used instead of diethanolamine. The precursor solution was applied to a base on which a platinum layer was formed (platinum layer/silicon oxide layer/silicon substrate) by spin coating, dried and pre-fired on a hot plate, and subjected to rapid thermal annealing at 700° C. This step was repeatedly performed several times to obtain a polycrystalline potassium sodium niobate (KNN) layer with a thickness of about 1.5 micrometers. A platinum electrode with a thickness of 100 nanometers and a diameter of 200 micrometers was formed on the KNN layer by sputtering. A capacitor sample was thus obtained.

Figure 7:
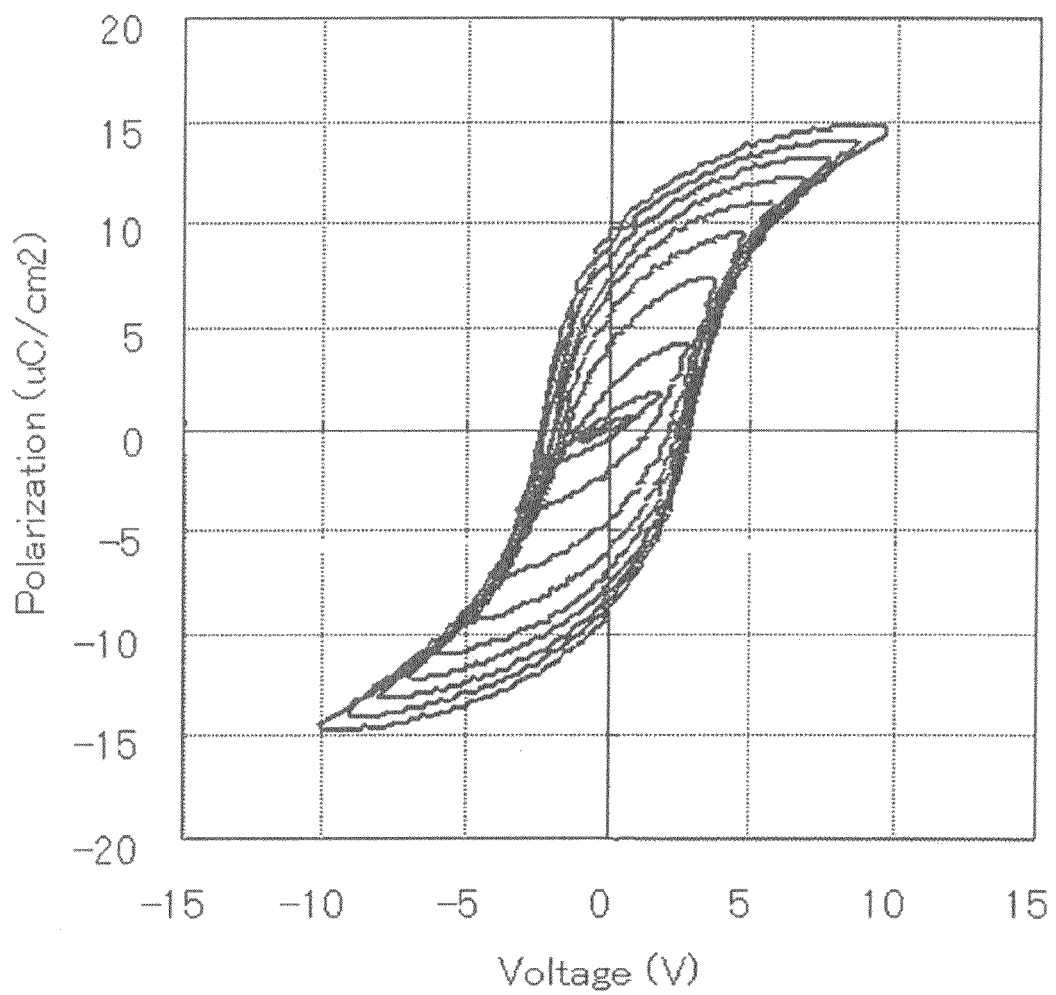
FIG. 7 is a graph showing the hysteresis characteristics of a piezoelectric layer in an example according to the invention.

Hysteresis characteristics were evaluated using the above capacitor sample. A hysteresis loop shown in FIG. 7 was obtained. As shown in FIG. 7, it was confirmed that the capacitor sample of this example exhibits excellent hysteresis characteristics and the KNN layer exhibits ferroelectricity.

2.2. Example 2 and Comparative Example 1

KNN layer forming precursor solutions were prepared in the same manner as in Example 1 except for changing the molar ratio (mol %) of sodium to potassium as shown in Table 1. Specifically, the ratio of sodium (amount of excess Na) to potassium in the precursor solution was adjusted to 10 mol %, 20 mol %, 40 mol %, and 50 mol %. The resulting precursor solutions were applied to an Nb:STO (Nb-doped $SrTiO_3$) single crystal substrate by spin coating, dried and prefired on a hot plate, and subjected to rapid thermal annealing at 700° C. This step was repeatedly performed several times to obtain four types of polycrystalline KNN layers with a thickness of about 1 micrometer.

TABLE 1

| Amount of excess Na in solution (mol %) | Composition $(K_a Na_{(1-a)})_x NbO_3$ |
|---|---|
| 10 | x = 1.04, a = 0.85 |
| 20 | x = 1.09, a = 0.79 |
| 40 | x = 1.08, a = 0.63 |
| 50 | x = 1.08, a = 0.56 |

As Comparative Example 1, a potassium niobate layer (KN layer) was formed in the same manner as in Example 2 except that sodium was not added to the precursor solution and potassium ethoxide and niobium ethoxide were mixed at a molar ratio of K:Nb=1.0:1.0.

The resulting KNN layer and KN layer were evaluated as follows.

(1) Compositional Analysis of KNN Layer

The composition of the KNN layer according to Example 2 was analyzed by induction-coupled plasma (ICP) emission spectrometry. The results are shown in Table 1. As shown in Table 1, it was confirmed that the KNN layer according to the example had a value for x in the formula $(K_a Na_{1-a})_x NbO_3$ greater than one, that is, K and Na were contained in excess of Nb in comparison with the stoichiometric composition. The value "x" was about 1.1 at maximum even when the amount of Na in the precursor solution was increased.

(2) Surface Observation by SEM

Figure 8A:
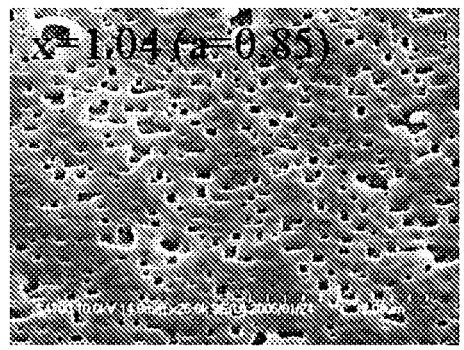
FIGS. 8A and 8B show SEM images of the surfaces of piezoelectric layers according to an example of the invention.
Figure 8B:
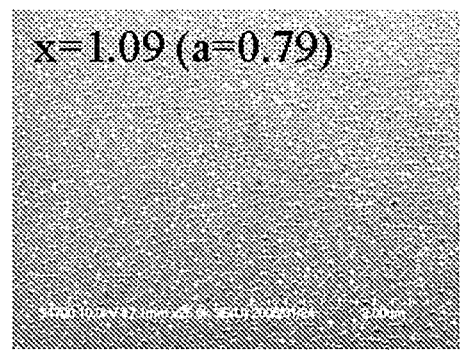
Figure 8C:
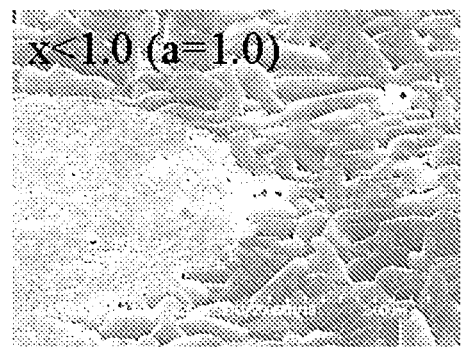
FIG. 8C shows an SEM image of the surface of a piezoelectric layer according to a comparative example.

The surfaces of two KNN layers (x=1.04 and 1.09) according to Example 2 and the KN layer according to Comparative Example 1 were observed by scanning electron microscopy (SEM). The results are shown in FIGS. 8A to 8C. FIGS. 8A and 8B show the results of Example 2, and FIG. 8C shows the results of Comparative Example 1. As shown in FIGS. 8A and 8B, it was confirmed that the KNN layer according to Example 2 exhibited a homogeneous and excellent morphology. As shown in FIG. 8C, it was confirmed that a heterophase was formed in the KN layer according to Comparative Example 1.

(3) Crystallinity Determined by XRD

Figure 9:
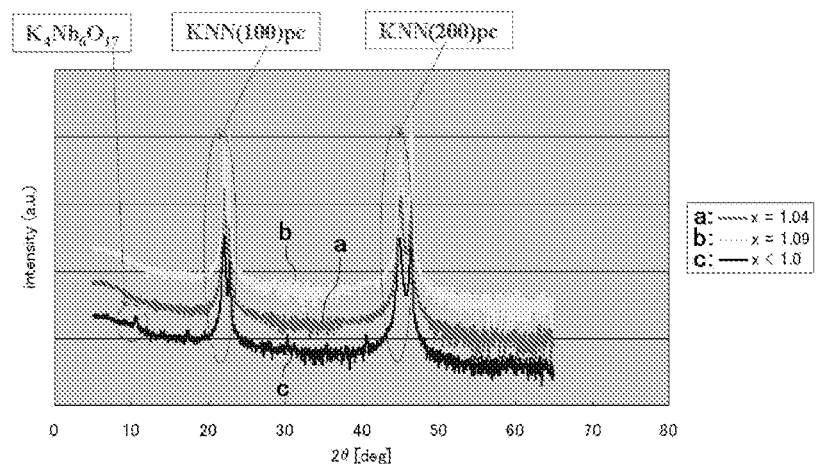
FIG. 9 shows an XRD image according to an example of the invention and a comparative example.

The crystallinity of the samples used in (2) was examined by X-ray diffraction (XRD) analysis. The results are shown in FIG. 9. In FIG. 9, the charts indicated by the symbols "a" and "b" show the results of the KNN layers according to Example 2, and the chart indicated by the symbol "c" shows the results of the KN layer according to Comparative Example 1.

As shown in FIG. 9, it was confirmed that the KNN layer according to Example 2 exhibited excellent crystallinity and was (100)-oriented. On the other hand, it was confirmed that the KN layer according to Comparative Example 1 showed a peak of a heterophase ($K_4Nb_6O_{17}$) and exhibited poor crystallinity.

(4) Raman Spectroscopy

Figure 12:
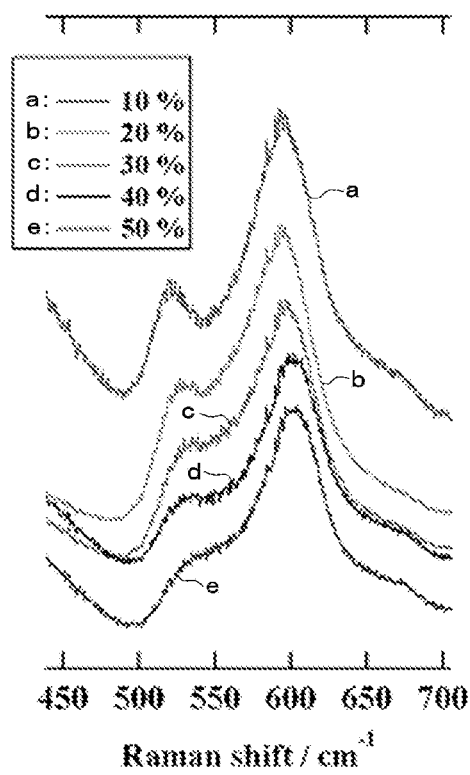
FIG. 12 shows Raman spectroscopy results according to an example of the invention.

The KNN layers obtained in Example 2 (i.e. KNN layers obtained using the precursor solutions in which the ratio of sodium (amount of excess Na) to potassium was adjusted to 10 mol %, 20 mol %, 40 mol %, and 50 mol %) and a KNN layer obtained in the same manner as in Example 2 using a precursor solution in which the amount of excess Na was adjusted to 30 mol % were subjected to Raman spectroscopy. The results are shown in FIG. 12. In FIG. 12, the symbols "a" to "e" respectively show the spectra when the amount of excess Na was 10 mol % to 50 mol %.

As is clear from the spectra shown in FIG. 12, the first peak (peak present between 500 and 550 $cm^{-1}$) attributed to the A site of KNN is shifted and the second peak near 600 $cm^{-1}$ is broadened depending on the amount of excess Na. Therefore, it was confirmed that potassium and sodium were present in the A site.

(5) Spacing Determined from X-Ray Analysis

The spacing in the (100) plane of each sample according to Example 2 was determined from the X-ray analysis (theta-2theta) peak. The results are shown in FIG. 13.

Figure 13:
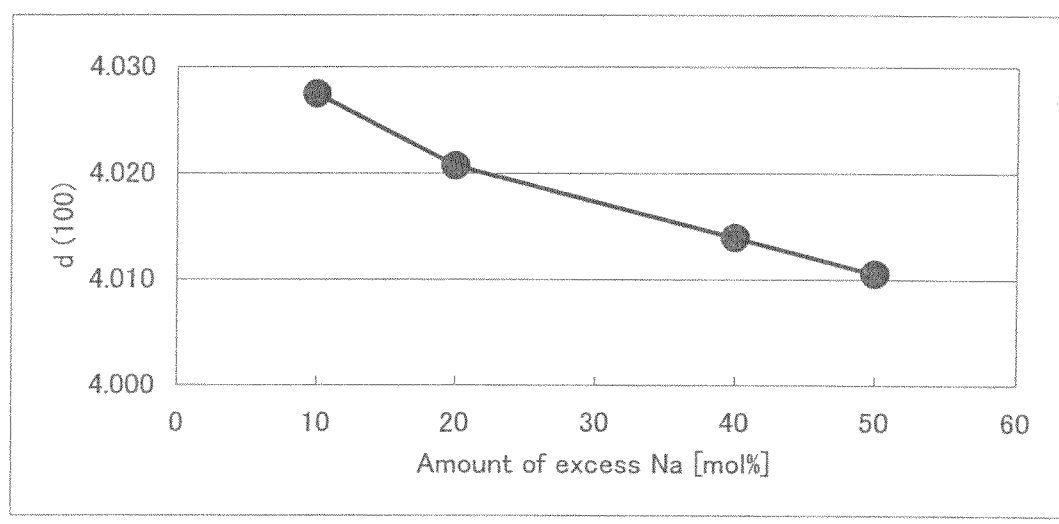
FIG. 13 shows the relationship between the amount of excess Na and the spacing according to an example of the invention.

As shown in FIG. 13, it was confirmed that the spacing (d(100)) decreases as the amount of excess Na increases. Specifically, since the atomic radius of sodium is smaller than that of potassium, the spacing decreases as the amount of sodium added increases. This also confirms that potassium and sodium were present in the A site.

2.3. Example 3

A KNN layer forming precursor solution was prepared in the same manner as in Example 1. The resulting precursor solution was applied to an Nb:STO (Nb-doped $SrTiO_3$) single crystal substrate by spin coating, dried and prefired on a hot plate, and subjected to rapid thermal annealing at 700° C. This step was repeatedly performed several times to obtain a polycrystalline KNN layer with a thickness of about 1 micrometer. A platinum electrode with a thickness of 100 nanometers and a diameter of about 30 micrometers was formed on the KNN layer using a lift-off method. The platinum layer was formed by sputtering. The substrate was bonded to a platinum-coated silicon substrate through a silver paste.

Figure 10:
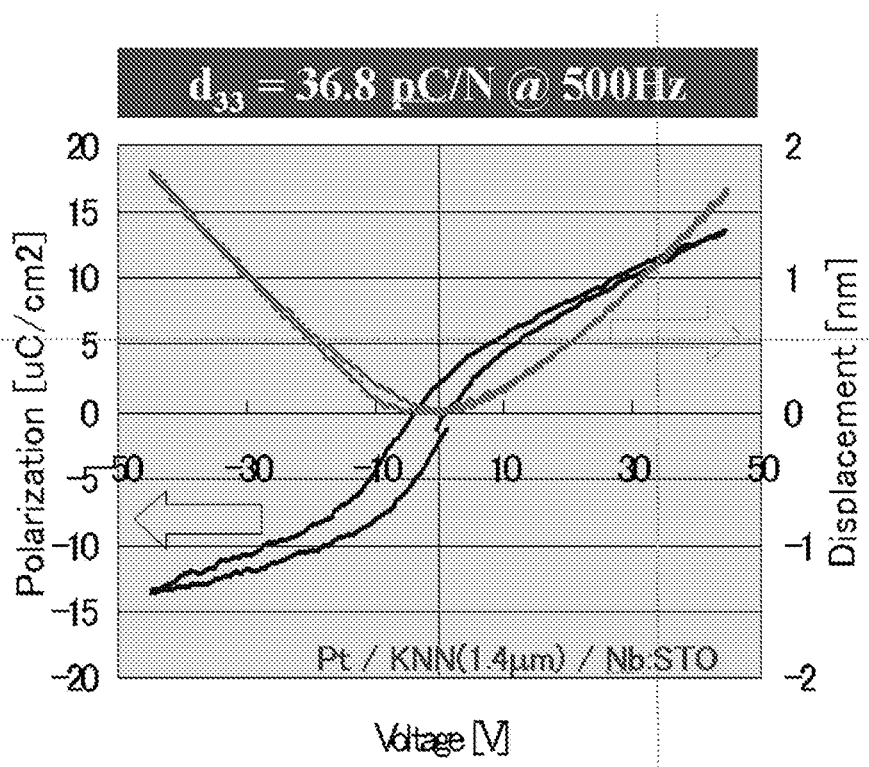
FIG. 10 shows the field-strain relationship of a piezoelectric layer according to an example of the invention.

The sample thus obtained was subjected to field-strain measurement using an atomic force microscope (AFM). The results are shown in FIG. 10. The field-strain curve shown in FIG. 10 indicates that the KNN layer according to this example produces a piezoelectric vibration due to application of voltage. It was also confirmed that the hysteresis curve observed in Example 1 originates in the piezoelectric characteristics of the KNN layer.

2.4. Example 4

A KNN layer forming precursor solution was prepared in the same manner as in Example 1. The resulting sol solution was applied to an STO (SrTiO$_3$) single crystal substrate by spin coating, dried and prefired on a hot plate, and subjected to rapid thermal annealing at 700° C. This step was repeatedly performed several tens of times to obtain a polycrystalline KNN layer with a thickness of about 10 micrometers. After planarizing the KNN layer by CMP, an aluminum layer with a thickness of 100 nanometers was deposited on the KNN layer, and a two-port comb electrode (L/S=5 micrometers) was formed by photolithography. An S21 parameter indicating SAW propagation characteristics was measured using a network analyzer.

Figure 11:
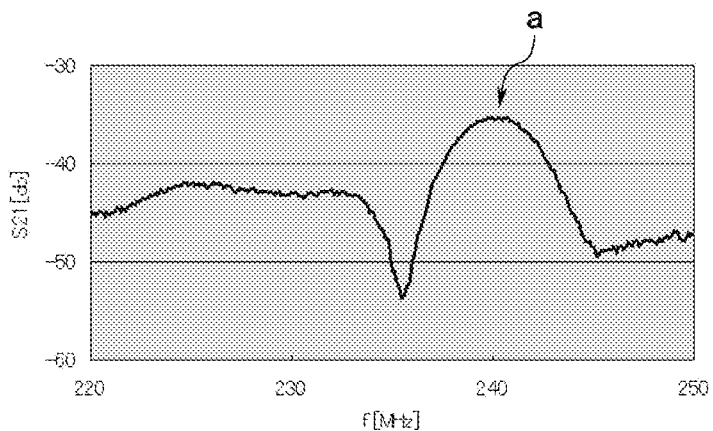
FIG. 11 shows the SAW oscillation waveform of a piezoelectric layer according to an example of the invention.

FIG. 11 shows the S21 parameter measurement results. The resonance waveform (indicated by the symbol "a") of the KNN/STO substrate with a specific bandwidth of about 15% was observed near 240 MHz. As shown in FIG. 11, it was confirmed that the KNN/STO substrate according to this example excites surface acoustic waves due to stress.

2.5. Example 5 and Reference Example 1

Potassium ethoxide, sodium ethoxide, and niobium ethoxide were mixed at a molar ratio of K:Na:Nb=1.0:0.2:1.0. The mixed liquid was refluxed in butyl cellosolve to prepare a triple alkoxide solution. Then, diethanolamine was added to the solution as a stabilizer. A precursor solution was thus prepared. Note that acetic acid may be used instead of diethanolamine. The precursor solution was applied to a substrate on which a polycrystalline nickel lanthanate (LNO) layer was formed as an orientation control layer (nickel lanthanate layer/platinum layer/silicon oxide layer/silicon substrate) by spin coating, dried and prefired on a hot plate, and subjected to rapid thermal annealing at 700° C. This step was repeatedly performed eight times to obtain a polycrystalline potassium sodium niobate (KNN) layer with a thickness of about 1 micrometer.

Figure 14A:
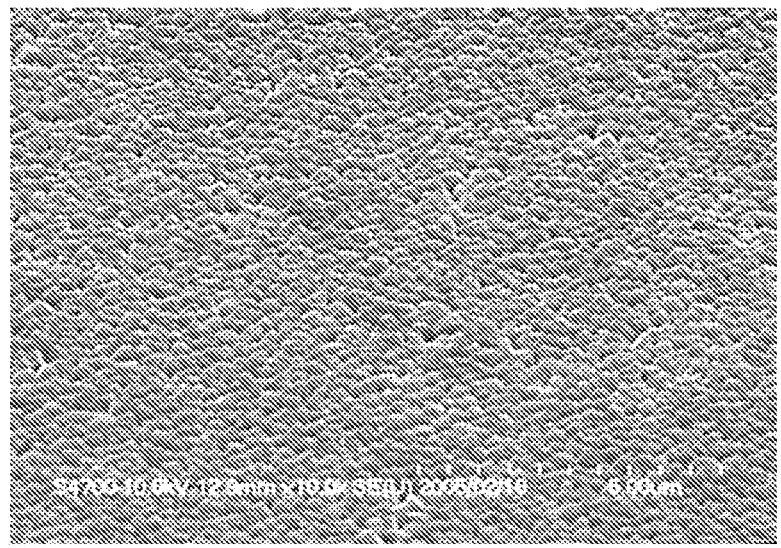
FIG. 14A shows an SEM surface image according to an example of the invention.
Figure 15A:
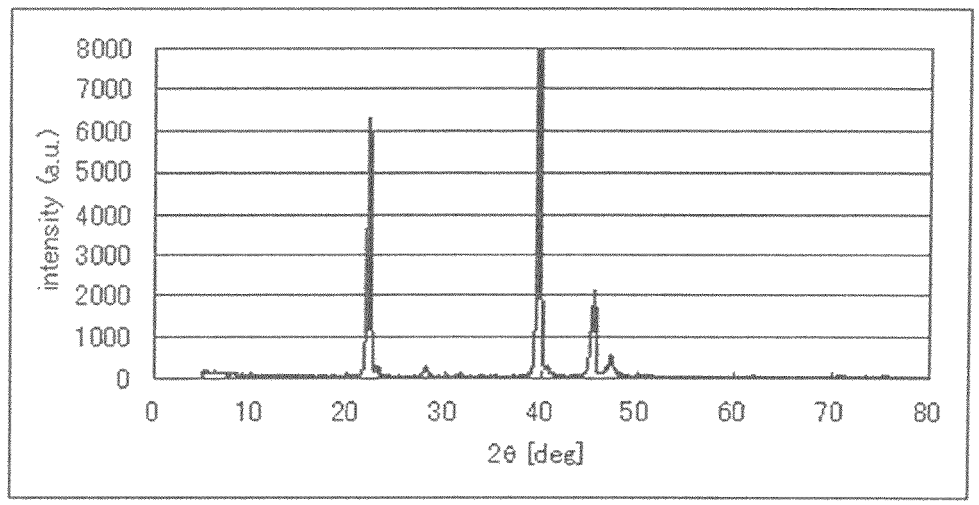
FIG. 15A shows an XRD image according to an example of the invention.

The surface flatness of the sample was evaluated by SEM. The results are shown in FIG. 14A. As is clear from these results, it was confirmed that the KNN layer according to this example was dense and exhibited excellent crystallinity due to the crystallinity of the LNO layer (orientation control layer). The crystallinity of the sample was determined by XRD. The results are shown in FIG. 15A. As is clear from these results, it was confirmed that the KNN layer according to this example was (100)-single-oriented even at a thickness of 1 micrometer.

An S parameter indicating SAW propagation characteristics was observed for the KNN layer of Example 5. The propagation loss was as small as −1 db or less, which is applicable to SAW devices and the like.

Figure 14B:
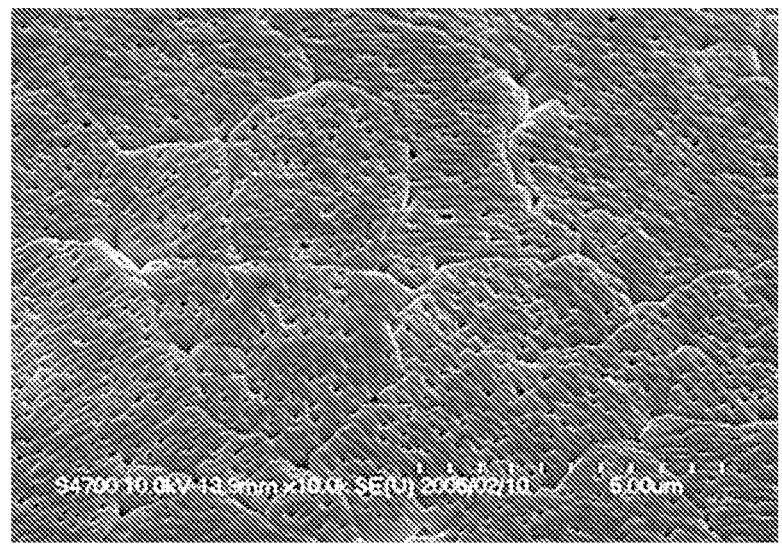
FIG. 14B shows an SEM surface image according to a reference example.
Figure 15B:
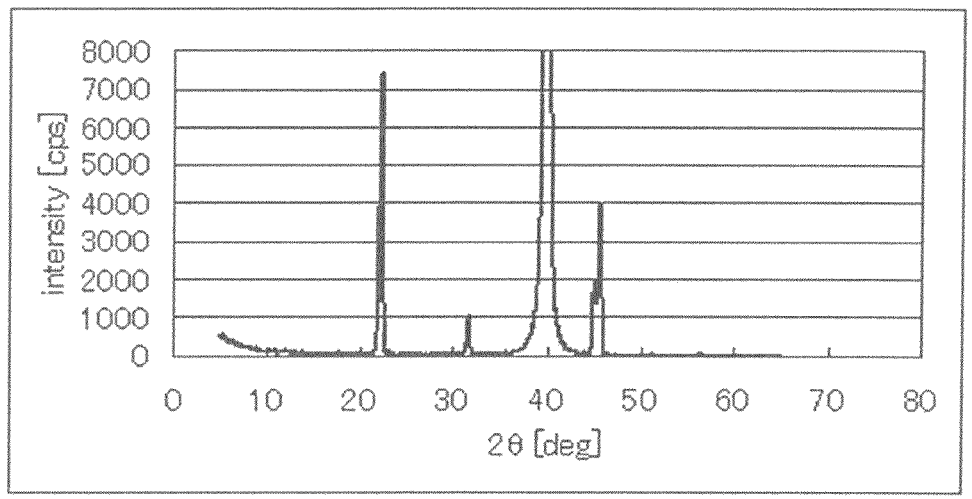
FIG. 15B shows an XRD image according to a reference example.

As Reference Example 1, a KNN layer was formed in the same manner as in Example 5 except that the orientation control layer was not formed. The surface flatness of this KNN layer was evaluated by SEM. The results are shown in FIG. 14B. As is clear from these results, since the KNN layer according to this example did not include an LNO layer as the orientation control layer, the surface flatness of the KNN layer was poor in comparison with Example 5. The crystallinity of the KNN layer was examined by XRD. The results are shown in FIG. 15B. As is clear from these results, it was confirmed that the KNN layer is randomly oriented when forming the KNN layer on the platinum layer.

3. APPLICATION EXAMPLE

3.1. Surface Acoustic Wave Device

An example of a surface acoustic wave device to which the first piezoelectric laminate 100 according to the invention is applied is described below with reference to the drawings.

Figure 16:
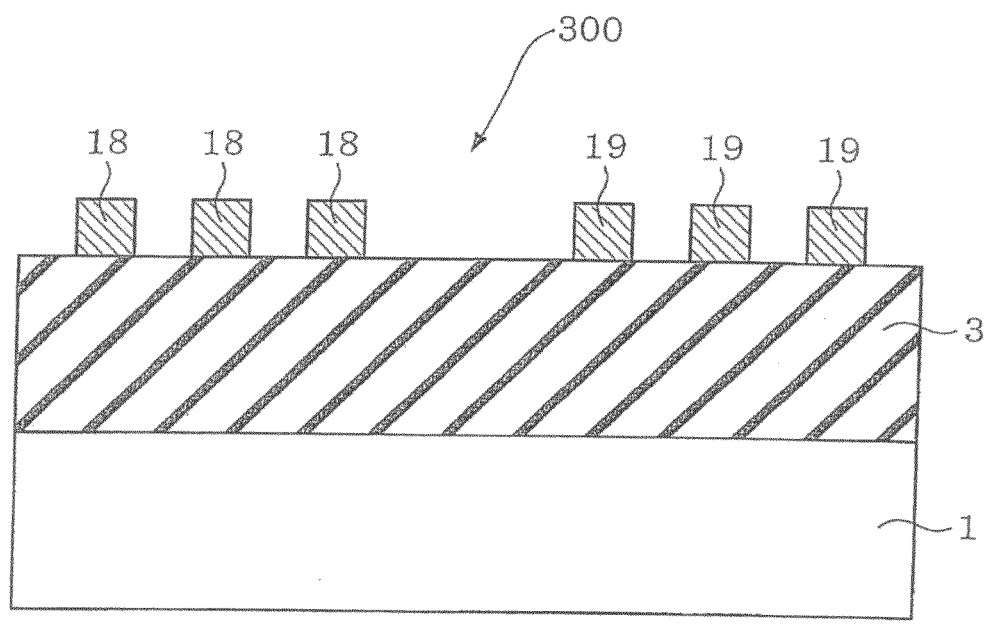
FIG. 16 is a view schematically showing a surface acoustic wave device according to one embodiment of the invention.

FIG. 16 is a cross-sectional view schematically showing a surface acoustic wave device 300 according to this embodiment.

The surface acoustic wave device 300 is formed by applying the first piezoelectric laminate 100 shown in FIGS. 1 and 4. Specifically, the surface acoustic wave device 300 includes the base 1 and the piezoelectric layer 3 formed on the base 1 of the first piezoelectric laminate 100, and electrodes (i.e. interdigital transducers (hereinafter called "IDT electrodes")) 18 and 19 formed on the piezoelectric layer 3. The IDT electrodes 18 and 19 are formed by patterning the electrode 4 shown in FIG. 2.

3.2. Frequency Filter

Figure 17:
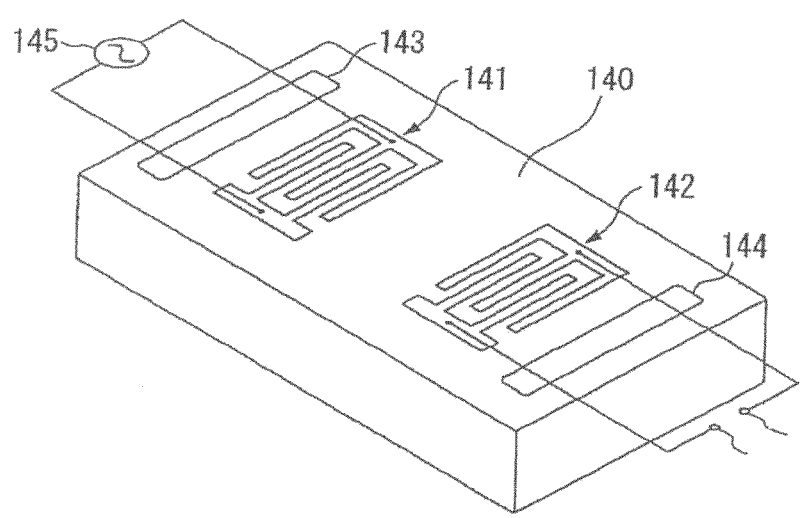
FIG. 17 is a view schematically showing a frequency filter to which is applied a surface acoustic wave device according to one embodiment of the invention.

An example of a frequency filter to which the surface acoustic wave device according to the invention is applied is described below with reference to the drawings. FIG. 17 is a view schematically showing the frequency filter.

As shown in FIG. 17, the frequency filter includes a laminate 140. As the laminate 140, a laminate (see FIG. 16) similar to that of the above-described surface acoustic wave device 300 may be used. Specifically, the laminate 140 may include the base 1 and the piezoelectric layer 3 shown in FIGS. 1 and 4.

The laminate 140 includes IDT electrodes 141 and 142 formed by patterning the electrode 4 shown in FIGS. 1 and 4 on its top surface. Sound absorbing sections 143 and 144 are formed on the top surface of the laminate 140 so that the IDT electrodes 141 and 142 are positioned in between. The sound absorbing sections 143 and 144 absorb surface acoustic waves propagated on the surface of the laminate 140. A high-frequency signal source 145 is connected with the IDT electrode 141, and signal lines are connected with the IDT electrode 142.

3.3. Oscillator

Figure 18:
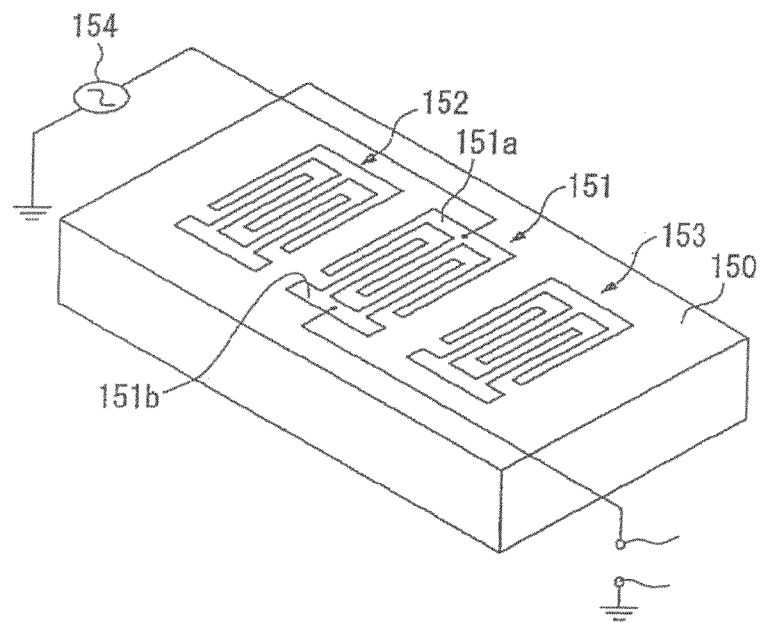
FIG. 18 is a view schematically showing an oscillator to which is applied a surface acoustic wave device according to one embodiment of the invention.

An example of an oscillator to which the surface acoustic wave device according to the invention is applied is described below with reference to the drawings. FIG. 18 is a view schematically showing the oscillator.

As shown in FIG. 18, the oscillator includes a laminate 150. As the laminate 150, a laminate (see FIG. 16) similar to that of the above-described surface acoustic wave device 300 may be used. Specifically, the laminate 150 may include the base 1 and the piezoelectric layer 3 shown in FIGS. 1 and 4.

An IDT electrode 151 is formed on the top surface of the laminate 150, and IDT electrodes 152 and 153 are formed so that the IDT electrode 151 is positioned in between. A high-frequency signal source 154 is connected with a comb-shaped electrode 151a forming the IDT electrode 151, and a signal line is connected with the other comb-shaped electrode 151b. The IDT electrode 151 corresponds to an electrode for applying an electric signal, and the IDT electrodes 152 and 153 correspond to resonation electrodes for causing a specific frequency component or a frequency component in a specific band of surface acoustic waves generated by the IDT electrode 151 to resonate.

The above-described oscillator may also be applied to a voltage controlled saw oscillator (VCSO).

As described above, the frequency filter and the oscillator may include the surface acoustic wave device according to the invention.

3.4. Thin-Film Piezoelectric Resonator

An example of a thin-film piezoelectric resonator to which the piezoelectric laminate according to the invention is applied is described below with reference to the drawings.

3.4.1. First Thin-Film Piezoelectric Resonator

Figure 19:
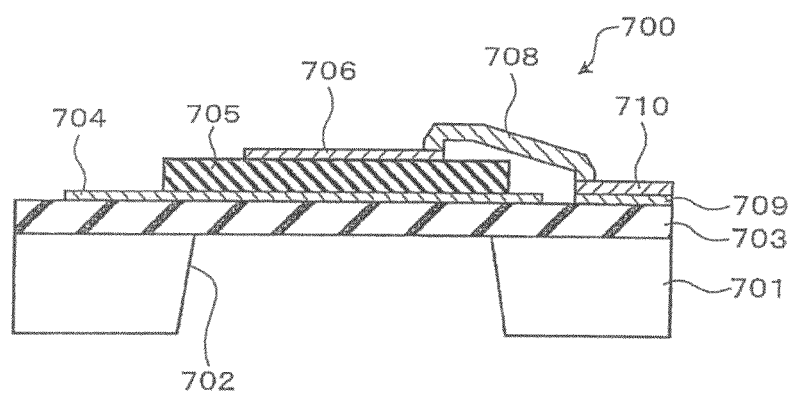
FIG. 19 is a view schematically showing a first thin-film piezoelectric resonator according to one embodiment of the invention.

FIG. 19 is a view schematically showing a first thin-film piezoelectric resonator 700 as an example of this embodiment. The first thin-film piezoelectric resonator 700 is a diaphragm type thin-film piezoelectric resonator.

The first thin-film piezoelectric resonator 700 includes a substrate 701, an elastic layer 703, a lower electrode 704, a piezoelectric layer 705, and an upper electrode 706. The substrate 701, the lower electrode 704, the piezoelectric layer 705, and the upper electrode 706 of the thin-film piezoelectric resonator 700 respectively correspond to the base 1, the lower electrode 2, the piezoelectric layer 3, and the upper electrode 4 of the piezoelectric laminate 200 shown in FIGS. 5 and 6. As the elastic layer 703, a layer such as a buffer layer not shown in FIG. 5 (orientation control layer in FIG. 6) may be used. Specifically, the first thin-film piezoelectric resonator 700 includes the piezoelectric laminate 200 shown in FIGS. 5 and 6.

A via-hole 702 is formed through the substrate 701. An interconnect 708 is provided on the upper electrode 706. The interconnect 708 is electrically connected with an electrode 709 formed on the elastic layer 703 through a pad 710.

3.4.2. Second Thin-Film Piezoelectric Resonator

Figure 20:
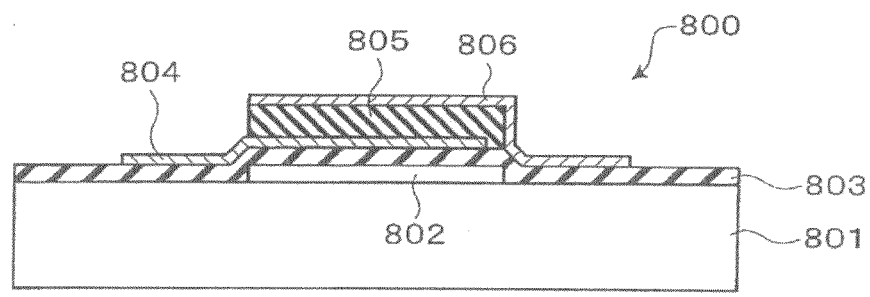
FIG. 20 is a view schematically showing a second thin-film piezoelectric resonator according to one embodiment of the invention.

FIG. 20 is a view schematically showing a second thin-film piezoelectric resonator 800 as another example of this embodiment. The second thin-film piezoelectric resonator 800 differs from the first thin-film piezoelectric resonator 700 shown in FIG. 19 in that an air gap 802 is formed between a substrate 801 and an elastic layer 803 without forming a via-hole.

The second thin-film piezoelectric resonator 800 includes a substrate 801, an elastic layer 803, a lower electrode 804, a piezoelectric layer 805, and an upper electrode 806. The substrate 801, the lower electrode 804, the piezoelectric layer 805, and the upper electrode 806 of the thin-film piezoelectric resonator 800 respectively correspond to the base 1, the lower electrode 2, the piezoelectric layer 3, and the upper electrode 4 of the piezoelectric laminate 200 shown in FIGS. 5 and 6. As the elastic layer 803, a layer such as a buffer layer not shown in FIG. 5 (orientation control layer 6 in FIG. 6) may be used. Specifically, the second thin-film piezoelectric resonator 800 includes the piezoelectric laminate 200 shown in FIGS. 5 and 6. The air gap 802 is the space formed between the substrate 801 and the elastic layer 803.

The thin-film piezoelectric resonator according to this embodiment (e.g. first thin-film piezoelectric resonator 700 and second thin-film piezoelectric resonator 800) can function as a resonator, a frequency filter, or an oscillator.

3.5. Piezoelectric Actuator

Figure 21:
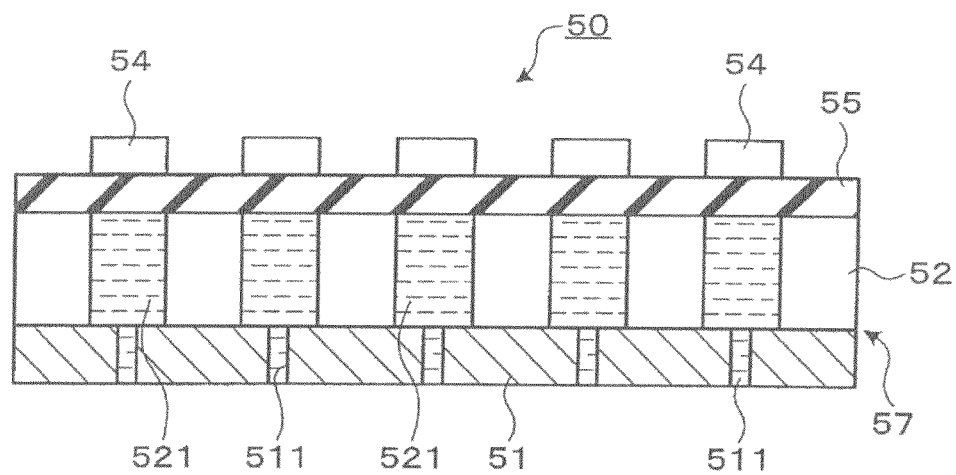
FIG. 21 is a view schematically showing an inkjet head to which is applied a piezoelectric actuator according to one embodiment of the invention.

An ink-jet recording head is described below as an example in which the second piezoelectric laminate 200 according to the invention is applied to a piezoelectric actuator. FIG. 21 is a cross-sectional view showing a schematic configuration of an inkjet recording head to which the piezoelectric actuator according to this embodiment is applied, and FIG. 22 is an exploded perspective view of the inkjet recording head which is illustrated in a vertically reversed state.

Figure 22:
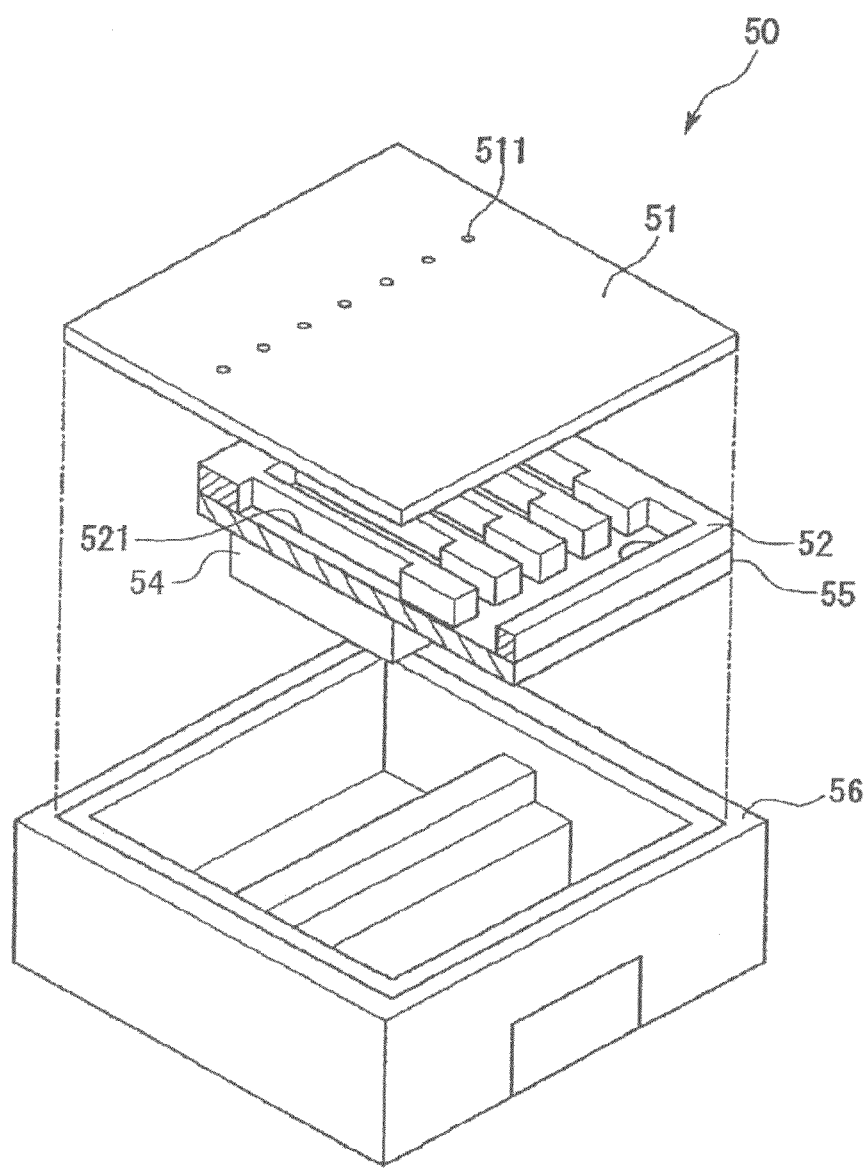
FIG. 22 is a perspective view schematically showing an inkjet head to which is applied a piezoelectric actuator according to one embodiment of the invention.

As shown in FIGS. 21 and 22, an inkjet recording head 50 includes a head body 57 and a piezoelectric section 54 formed above the head body 57. The piezoelectric laminate 200 shown in FIGS. 5 and 6 is applied as the piezoelectric section 54, in which the lower electrode 2, the piezoelectric layer 3, and the upper electrode 4 are stacked in that order. In the inkjet recording head, the piezoelectric section 54 functions as a piezoelectric actuator.

The head body 57 includes a nozzle plate 51, an ink chamber substrate 52, and an elastic layer 55. The base 1 of the piezoelectric laminate 200 shown in FIGS. 5 and 6 forms the elastic layer 55 shown in FIG. 21. As the elastic layer 55, a layer such as a buffer layer not shown in FIGS. 5 and 6 may be used. The base 1 of the piezoelectric laminate 200 also forms the ink chamber substrate 52 shown in FIG. 21. A cavity 521 is formed in the ink chamber substrate 52. A nozzle 511 continuous with the cavity 521 is formed in the nozzle plate 51. As shown in FIG. 22, these members are accommodated in a housing 56 to form the inkjet recording head 50. The diameter of the nozzle 511 is 10 to 30 micrometers. The nozzles 511 are formed at a pitch of 90 to 300 nozzles per inch.

Each piezoelectric section is electrically connected with a piezoelectric device driver circuit (not shown), and is actuated (vibrate or displaced) based on a signal from the piezoelectric device driver circuit. Specifically, each piezoelectric section 54 functions as a vibration source (head actuator). The elastic layer 55 vibrates due to vibration (deflection) of the piezoelectric section 54, and functions to momentarily increase the pressure inside the cavity 521. The maximum voltage applied to the piezoelectric is 20 to 40 V. The piezoelectric is driven at 20 to 50 kHz. The amount of ink discharged is typically 2 to 5 picoliters.

The inkjet recording head which discharges ink has been described above as an example. Note that this embodiment aims at a liquid jetting head utilizing a piezoelectric laminate as a piezoelectric actuator. As the liquid jetting head, a recording head used for an image recording device such as a printer, a color material jetting head used to produce a color filter for a liquid crystal display or the like, an electrode material jetting head used to form an electrode for an organic EL display, a field emission display (FED), or the like, a bio-organic substance jetting head used to produce a bio-chip, and the like can be given.

The invention is not limited to the above-described embodiments, and various modifications can be made. For example, the invention includes various other configurations substantially the same as the configurations described in the embodiments (in function, method and result, or in objective and result, for example). The invention also includes a configuration in which an unsubstantial portion in the described embodiments is replaced. The invention also includes a configuration having the same effects as the configurations described in the embodiments, or a configuration able to achieve the same objective. Further, the invention includes a configuration in which a publicly known technique is added to the configurations in the embodiments.

Although only some embodiments of the invention have been described in detail above, those skilled in the art will readily appreciate that many modifications are possible in the embodiments without materially departing from the novel teachings and advantages of this invention. Accordingly, all such modifications are intended to be included within the scope of the invention.

What is claimed is:

1. An inkjet recording head including a piezoelectric actuator, the piezoelectric actuator comprising:
   a lower electrode;
   a piezoelectric layer formed above the lower electrode and having a compositional formula $(K_a Na_{1-a})_x NbO_3$; and
   an upper electrode formed above the piezoelectric layer;
   wherein "a" is $0.56 < a < 0.85$ and "x" is $1.04 < x \leq 1.08$.

2. The inkjet recording head according to claim 1, wherein the piezoelectric layer includes pseudocubic (100) preferentially orientation.

3. The inkjet recording head according to claim 1, wherein a thickness of the piezoelectric layer is 300 nanometers to 3.0 micrometers.

4. A liquid jetting head, comprising:
   a piezoelectric section having a compositional formula $(K_a Na_{1-a})_x NbO_3$; and
   an electrode applying a voltage to the piezoelectric section;
   wherein "a" is $0.56 < a < 0.85$ and "x" is $1.04 < x \leq 1.08$.

5. A printer, comprising the inkjet recording head according to claim 1.

6. An image recording device, comprising the liquid jetting head according to claim 4.

* * * * *